United States Patent [19]
Bailey

[11] Patent Number: 5,672,440
[45] Date of Patent: Sep. 30, 1997

[54] CELL TESTER DEVICE EMPLOYING A CATHODICALLY DEPOSITABLE METAL ION ELECTROLYTE SOLUTION

[75] Inventor: John C. Bailey, Columbia Station, Ohio

[73] Assignee: Eveready Battery Company, St. Louis, Mo.

[21] Appl. No.: 455,951

[22] Filed: May 31, 1995

Related U.S. Application Data

[63] Continuation-in-part of Ser. No. 396,505, Nov. 8, 1994, which is a continuation-in-part of Ser. No. 246,926, May 20, 1994, Pat. No. 5,458,992, which is a continuation of Ser. No. 648,080, Jan. 31, 1991, abandoned.

[51] Int. Cl.$^6$ ................................................... H01M 10/48
[52] U.S. Cl. ............................ 429/93; 361/505; 361/526
[58] Field of Search ........................ 429/92, 93; 361/505, 361/526

[56] References Cited

U.S. PATENT DOCUMENTS

| | | |
|---|---|---|
| 945,564 | 1/1910 | Marko . |
| 1,497,388 | 6/1924 | Sterling . |
| 2,988,590 | 6/1961 | André . |
| 3,280,701 | 10/1966 | Donnelly et al. . |

(List continued on next page.)

FOREIGN PATENT DOCUMENTS

| | | |
|---|---|---|
| 300917A1 | 1/1989 | European Pat. Off. . |
| 497616A2 | 8/1992 | European Pat. Off. . |
| 501609A1 | 9/1992 | European Pat. Off. . |
| 60-66170 | 4/1985 | Japan . |
| 63-179269 | 7/1988 | Japan . |
| 2-41365 | 9/1988 | Japan . |
| 63-213256 | 9/1988 | Japan . |
| 2-100269 | 4/1990 | Japan . |
| WO92/03852 | 3/1992 | WIPO . |
| WO93/06474 | 4/1993 | WIPO . |
| WO94/15246 | 7/1994 | WIPO . |

OTHER PUBLICATIONS

My T. Nguyên and Lê H. Dao "Poly(N–Benzylaniline/ (Poly(AMPs)/WO$_3$) Solid–State Electrochromic Cell," *J. Electrochem. Soc.*, 136, 2131 (1989).

M. K. Carpenter & D. A. Corrigan, *Proceedings of the Symposium on Elecrohcormic Material*, vol. 90–2, Editors, The Electrochemical Society, Inc. Princeton, N.J., 1990; and.

C. M. Lampert and C. G. Granqvist, *Large–Area Chromogenics: Materials and Devices for Transmittance Control*, vol. IS4, Editors, SPIE Optical Engineering Press, Bellingham, Washington, 1989.

*Primary Examiner*—Stephen J. Kalafut
*Attorney, Agent, or Firm*—Robert W. Welsh

[57] ABSTRACT

A cell tester device for use on an electrochemical cell which comprises an electrolyte containing a cathodically reducible metal ion that changes its visible appearance when it is reduced upon application of a power source.

24 Claims, 2 Drawing Sheets

U.S. PATENT DOCUMENTS

| | | | |
|---|---|---|---|
| 3,609,468 | 9/1971 | Kihara et al. | 361/505 |
| 3,667,039 | 5/1972 | Garfein et al. . | |
| 4,097,655 | 6/1978 | Witzke | 429/111 |
| 4,304,465 | 12/1981 | Diaz . | |
| 4,379,816 | 4/1983 | Mullersman et al. | 429/91 |
| 4,442,187 | 4/1984 | MacDiarmid et al. | 429/213 |
| 4,497,881 | 2/1985 | Bertolino . | |
| 4,538,158 | 8/1985 | Warszawski . | |
| 4,596,722 | 6/1986 | Warszawski . | |
| 4,680,527 | 7/1987 | Benenati et al. . | |
| 4,702,563 | 10/1987 | Parker . | |
| 4,702,564 | 10/1987 | Parker . | |
| 4,723,656 | 2/1988 | Kiernan et al. . | |
| 4,726,661 | 2/1988 | Parker . | |
| 4,737,020 | 4/1988 | Parker . | |
| 4,801,514 | 1/1989 | Will et al. | 429/167 |
| 4,835,475 | 5/1989 | Hanakura et al. . | |
| 4,835,476 | 5/1989 | Kurosawa . | |
| 4,902,108 | 2/1990 | Byker . | |
| 4,911,994 | 3/1990 | Will et al. | 429/167 |
| 4,917,973 | 4/1990 | Yoshimoto et al. | 429/91 |
| 4,940,640 | 7/1990 | MacDiarmid | 429/213 |
| 5,015,544 | 5/1991 | Burroughs et al. . | |
| 5,054,894 | 10/1991 | Warszawski . | |
| 5,056,899 | 10/1991 | Warszawski . | |
| 5,059,895 | 10/1991 | Cataldi et al. . | |
| 5,074,648 | 12/1991 | Warszawski . | |
| 5,078,480 | 1/1992 | Warszawski . | |
| 5,080,470 | 1/1992 | Warszawski . | |
| 5,082,355 | 1/1992 | Warszawski . | |
| 5,156,931 | 10/1992 | Burroughs et al. | 429/93 |
| 5,196,144 | 3/1993 | Smith et al. . | |
| 5,223,003 | 6/1993 | Tucholski et al. | 29/623.4 |
| 5,232,631 | 8/1993 | Cao et al. . | |
| 5,250,905 | 10/1993 | Kuo et al. . | |
| 5,256,500 | 10/1993 | Ishimoto . | |
| 5,332,530 | 7/1994 | Eid et al. | 252/583 |
| 5,339,024 | 8/1994 | Kuo et al. | 324/435 |
| 5,396,177 | 3/1995 | Kuo et al. | 324/435 |
| 5,409,788 | 4/1995 | Weiss et al. | 429/93 X |
| 5,413,739 | 5/1995 | Coleman | 252/511 |

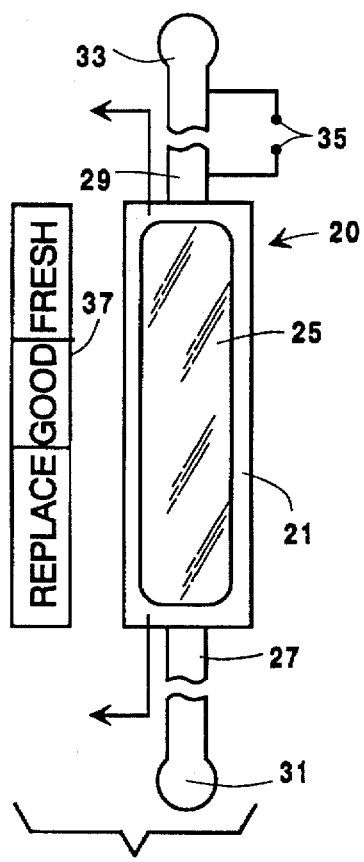
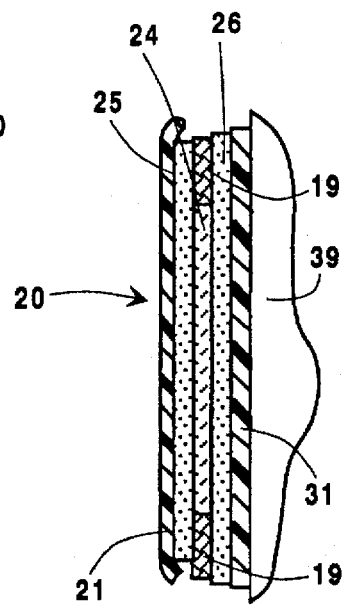
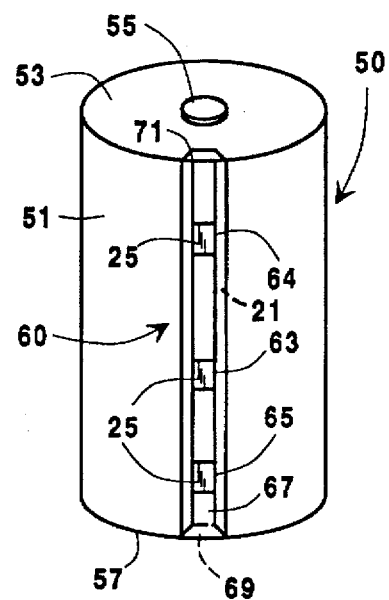
Fig. 1         Fig. 2         Fig. 3
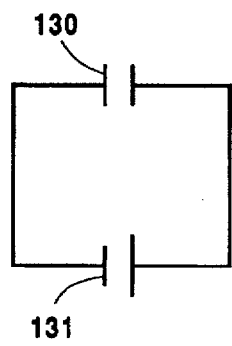
Fig. 4         Fig. 5         Fig. 6

CELL TESTER DEVICE EMPLOYING A CATHODICALLY DEPOSITABLE METAL ION ELECTROLYTE SOLUTION

This application is a continuation-in-part of U.S. patent application Ser. No. 396,505, filed Nov. 8, 1994, which is a continuation-in-part of U.S. patent application Ser. No. 246,926, filed May 20, 1994, now U.S. Pat. No. 5,458,992 which is a continuation of U.S. patent application Ser. No. 648,080, filed Jan. 31, 1991, now abandoned.

FIELD OF THE INVENTION

The invention relates to a tester device for electrochemical cells which device comprises an ionically conductive electrolyte disposed in the space between two electrodes, and contains at least one reducible metal ion so that when the electrodes are connected to a power source, the metal ion will be reduced, undergo a color change and be deposited on at least one of the electrodes. The change in color will provide a visual indication of the condition of the power source.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light absorbing material. A conductive material, which may taper outwardly in opposite directions from a central point to a pair of terminals, is then deposited atop the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp- hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery. U.S. Pat. No. 5,059,895 discloses a battery voltmeter comprising:

(A) dielectric layer;

(B) a conductive layer above or below one of the surfaces of the dielectric layer; and (C) a temperature sensitive color indicator layer in thermal contact with the conductive layer, characterized in that the conductive layer has (1) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;

(ii) an electrically conductive layer disposed on one side of the film base, (iii) a protective layer disposed on the electrically conductive layer, and (iv) a thermochromic layer disposed on the other side of the film base.

U.S. Pat. No. 4,442,187 discloses batteries having conjugated polymer electrodes in which the conjugated polymers are doped with ionic dopant species to a preselected room temperature electrical conductivity ranging from that characteristic of semiconductor behavior to that characteristic of metallic behavior, by means of reversible electrochemical doping procedures. The electrochemical doping reactions and their reverse electrochemical undoping reactions are utilized as the charging and discharging mechanisms of lightweight secondary batteries which employ doped or dopable conjugated polymer as one or both of their electrodes.

U.S. Pat. No. 4,940,640 discloses polyaniline electrodes in which the oxidation and hydrogenation levels of the polyaniline species of the electrodes are carefully controlled. Electrochemical cells employing these electrodes function by reversible oxidation and reduction of the polyaniline species forming the electrode.

U.S. Pat. No. 5,232,631 discloses solutions and plasticized compositions of electrically conductive substituted and unsubstituted polyanilines in nonpolar organic fluid phases with functionalized protonic acids and the use of such compositions for various applications such as conductive articles.

European Patent Application 497616-A2 discloses a tester for use in determining the voltage and state-of-charge of a battery. The tester can be permanently mounted on the battery and employs an electrochromic cell which changes visual appearance, for example, color or intensity of color when electrically connected across the terminals of a battery. The electrochromic cell undergoes an oxidation/reduction reaction on direct application of the DC potential of the battery. The color of the electrochromic cell can be compared with a color comparison chart to determine the condition of the battery. The tester can be permanently electrically connected to the battery or, preferably, can be connected momentarily to determine the state of the battery.

U.S. Pat. No. 5,080,470 discloses a process for manufacturing a light modulating device employing an elementary light-modulating cell comprising a first transparent electrode, also called the working electrode; a second electrode or counter-electrode (which may be transparent or non-transparent, depending on whether the picture element is observed by direct transmission of light or by reflection); an ionic conductor or electrolytic material placed between the electrodes; means of electro-chromism; means of electrical connection to an external source of electrical voltage enabling the cell to be controlled; and means of addressing (direct, multiplexed, and so forth) enabling its selective control (present if an elementary cell is part of a multiplicity of elementary cells in one same display device). The ionic conductor or electrolyte could preferably comprise a water-soluble salt or a water-soluble mixture of salts of at least one metal which can be cathodically deposited from an aqueous solution of one of its simple or complex ions; at least one initially water-soluble film-forming polymer resin, preferably in the proportion of one part by weight to 0.05 to 50 parts of anhydrous salts; and water.

An object of the present invention is to provide a cell tester device employing an electrically conductive transparent or translucent electrode spaced apart from a conductive layer or film, and wherein an ionically conductive electrolyte gel is disposed between said electrode and said conductive layer and said electrolyte containing a cathodically depositable metal ion.

Another object of this present invention is to provide a cell tester device that utilizes the electrolyte also as one of the electrodes, thus making the device cost effective to produce and suitable for efficient automatic assembly.

These and other objects will be apparent from the following description.

SUMMARY OF THE INVENTION

The invention relates to a cell tester device for an electrochemical cell having a first terminal and a second terminal of opposite polarity; a first electrically conductive electrode (working) adapted to contact the first terminal of the cell; a conductive layer (counter electrode) spaced apart from and preferably disposed over said first electrode and adapted to contact the second terminal of the cell; and an immobilized metal ion electrolyte, such as an aqueous metal ion gel electrolyte, disposed between and in contact with the electrode and the conductive layer, said electrolyte comprising a solution of at least one salt, such as an aqueous solution of at least one water-soluble salt, of at least one metal which can be cathodically deposited from the solution of one of its simple or complex ions at least at the interface of the first electrode and the electrolyte and the deposited metal ion having a different color than the electrolyte so that when the first electrode makes contact with the first terminal of the cell and the conductive layer makes contact with the second terminal of the cell, the metal ion in the electrolyte will be reduced to provide a deposit at said interface that has a different visual appearance than the electrolyte that can be used to indicate the condition of the cell.

As used herein a change in visual appearance shall mean a change in color or intensity of color. Gel shall mean a viscous solution with or without a binder or resin.

In another aspect of the invention, the electrolyte gel could be deposited into the pores of the first electrode which could comprise a composite of transparent conductive particles in a resin binder. In the use of this type of first electrode composite containing sufficient electrolyte in the pores of the composite, the metal ions will be reduced and cause the ions to change in visual appearance when a suitable voltage is applied across the electrode and conductive layer. This could increase the rate of change in the visual appearance of the electrolyte gel as viewed through the first electrode.

As used herein, the first electrode can also be referred to as the working electrode in tht the metal ions will be deposited at the interface between the electrode and the electrolyte.

The cell testing device is provided for detecting and measuring the state-of-charge of a cell or battery. The test device employs an electrolyte gel that changes visual appearance as the metal ions are reduced in the electrolyte gel under the influence of a direct current potential applied from the battery directly across the working electrode and the conductive layer (counter electrode).

In the preferred embodiment of the invention, the tester is incorporated into a label for a battery. In this embodiment, the tester is comprised of a conductive transparent or translucent working electrode and a spaced apart conductive layer. The conductive layer can be superimposed on the working electrodes or disposed beside it in a side-by-side configuration. A layer of ionically conductive electrolyte gel material is disposed between these components and preferably sealed between the electrode and conductive layer using a suitable adhesive disposed around the periphery of the electrolyte gel and between the electrode and conductive layer. The label can comprise one or more substrates or layers, and the components of the tester can be disposed on one or many of the different substrates or layers.

The cathodically depositable metal can be a single metal or several metals chosen from most of the metals that can be deposited alone or cojointly deposited with one or more additional metals. A requirement of the metal is that its ion be a cathodically reducible metal ion and that the deposited metal ion undergo a visual appearance change. Preferably, the metal should be self-erasing so that once the power source is removed, the material returns to its original color. Suitable metals are zinc, cadmium, lead, silver, copper, iron, cobalt, nickel, tin, indium, platinum, palladium, gold, bismuth, antimony, tellurium, manganese, thallium, selenium, gallium, chromium, tungsten and molybdenum. Generally the metals should be associated with any of a large number of water-soluble film-forming polymer resins. The actual crystalline structure of the developed metallic deposit, which appears interspersed in a network of the polymer resin, could be that of a highly divided state with regard to appearance and optical density. The network can be formed in several ways. For example, a porous polymeric matrix (network), such as a porous polyolefin separator material, can be impregnated with the electrolyte solution to form an immobilized electrolyte. Alternatively, the film-forming polymer material in the form of an emulsion or a solution in a nonaqueous solvent can be mixed with the electrolyte-forming compounds to form an electrolyte gel. Preferably, water-soluble film-forming polymers are used to form the electrolyte gel.

The electrolytic gel can contain, in addition to the already mentioned electro-depositable cations, cations of metals which cannot be electro-deposited from the solution in substantial proportions. This characteristic produces a greater flexibility in the formulation of electrolytic materials that can respond to various individual applications requirements. The preferred metals for use in this invention are bismuth, zinc, lead, copper, silver and mixtures thereof. Preferably, the metallic deposit formed at the interface region should be capable of being redissolved by anodic oxidation, without a residual deposit remaining.

The metallic salts for use in this invention are ionic compounds in which the metal is present in cationic form or incorporated in a cationic complex; the anions of these compounds, and other conditions (particularly the pH), are chosen such that the compounds are substantially soluble. Appropriate anions could be found, for example, among the following: chloride, nitrate, sulphate, borate, fluoride, iodide, bromide, fluoroborate, fluorosilicate, fluorogallate, dihydrogen phosphate, chlorate, perchlorate, bromate, selenate, thiosulfate, thiocyanate, formate, acetate, butyrate, hexanoate, adipate, citrate, lactate, oleate, oxalate, propionate, salicylate, glycinate, glycocollate, glycerophosphate, tartrate, acetyl-acetonate, isopropylate, benzoate, malate, benzene sulphonate, and 1-phenol-4-sulphonate, in particular. The preferred anions can be found in chloride, bromide, acetate and nitrate. The anion, which provides the oxidizable counter ion, may be provided in a compound separate from that compound containing the metal cation.

The water-soluble film-forming polymer resins comprise resins capable of forming actual aqueous gels. Suitable resins are polymers such as polypropylene oxide, polyethylene oxide, polyoxyethylene, polyvinylpyrrolidone, polyvinyl alcohol, the cellulosic ethers such as, for example, hydroxyethyl cellulose, hydroxypropyl cellulose and carboxymethyl cellulose, sodium alginate, polyacrylic acid and its derivatives, gelatin, gum arabic, polystyrene sulfonic acid, polyacrylamide, and in particular several resins which are compatible with each other (that is, which are not coprecipitant) which can be used in a mixture. The polymer resin provides the material or fluid formative composition with a viscosity which facilitates application in thin layers, a viscosity which can be adjusted in various conventional ways.

The translucent or transparent working electrode can be made of transparent or translucent conductive powders of non-stoichiometric oxides. Preferred oxides are indium-tin oxide, antimony-tin oxide, transparent or translucent conductive powders of non-stoichiometric oxides. Preferred oxides are indium-tin oxide, antimony-tin oxide, fluoride-doped tin oxide and aluminum-zinc oxide mixed with a suitable binder or resin so that the electrode could preferably be deposited on a substrate such as a transparent plastic sheet. The conductive layer could be selected from the group consisting of copper, carbon, silver, nickel, titanium and electrically conductive polymers. Again, the conductive layer could be preferably deposited over the gel electrolyte by printing or other suitable means.

Additional ionically conductive electrolyte materials suitable for use in the cell tester device may be liquid or solid, or combinations thereof, e.g., polymer electrolyte materials such as poly-2- acrylamido-2-methyl propanesulfonic acid [poly(AMPS)], polystyrenesulfonic acid, or polymers containing effective amounts of aqueous electrolytes so as to form an ionically conductive gel, e.g., polyethylene oxide containing an aqueous solution of HCl or $H_2SO_4$ or an electrolyte salt. The electrolyte should have sufficient ionic conductivity to operate the cell tester device. It is preferred that the electrolyte be a gel electrolyte which can be applied by a high speed printing or coating process and contain a pigment such as titanium dioxide to provide a white contrast, substituted titanium dioxides to produce various shades of yellow, or other inorganic or organic pigments. Preferably, the contrast agent is not conductive and is used only in the gel electrolyte.

For faster drying time, the electrolyte layer can be prepared using an organic solvent and a polymeric binder which is soluble in both the organic solvent and water, e.g., polyvinyl alcohol or polyethylene oxide. The electrolyte salts are first dissolved in water, and this solution is then dried to produce a powder comprising the salts dispersed in both the polymer and the pigment. This powder is then re-wet with the organic solvent which dissolves the polymeric binder. The resulting material is then applied, e.g., by printing, and the fast-drying organic solvent evaporates, forming the dry electrolyte layer. During tester assembly, the dry electrolyte layer absorbs moisture from the air and functions as an aqueous gel electrolyte. Alternatively, the dry ingredients of the electrolyte in finely powdered form can be dry-blended and then combined with an organic solution of the polymeric binder for printing.

Preferably, the working electrode, the conductive layer and electrolyte could be printed or painted on a plastic sheet in the appropriate order. The thickness of the working electrode and conductive layer could each vary from 0.1 to 250 microns, preferably from 1 to 100 microns and most preferably from 3 to 30 microns. Preferably, the thickness of the gel electrolyte should be from 1 to 250 microns, more preferably from 2 to 100 microns and most preferably from 10 to 30 microns. The total thickness of the cell tester device could vary from 1.2 to 750 microns, and preferably from 3 to 300 microns.

Suitable translucent or transparent plastic films for use as the substrate of this invention are polyesters, polyvinyl chloride (PVC), polyethylene, polyvinylidene chloride and polycarbonates with PVC being the preferred material.

The preferred embodiment of the invention would be a tester device comprising an electrically conductive working electrode composite containing electrically conductive particles of indium-tin oxide (ITO); an electrically conductive layer of carbon and a metal ion gel electrolyte composed of hydroxyethyl cellulose, $CuCl_2$, $BiCl_3$, LiBr and pigment (e.g., $TiO_2$ is white pigment). The components are assembled as discussed above. The components are assembled as discussed above. The aqueous gel electrolyte layer would contain the cathodically reducible metal ion $Bi^{+++}$ along with the oxidizable $Br^-$ counter ion. When voltage is applied across the device, the metal ion is reduced forming a black metallic Bi deposit against the white pigment of the $TiO_2$ in the electrolyte gel. This will produce a visual appearance change in the electrolyte gel due to the deposit of Bi which can be seen through the working electrode. The electrochemical reactions are believed to be as follows:

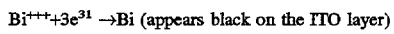

$Bi^{+++} + 3e^{31} \rightarrow Bi$ (appears black on the ITO layer)

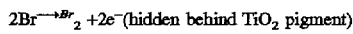

$2Br^- \rightarrow Br_2 + 2e^-$ (hidden behind $TiO_2$ pigment)

The Bi will be deposited at the interface of the working electrode and the electrolyte gel while the $Br_2$ will be produced at the interface of the conductive carbon layer and the gel electrolyte. Thus the gel electrolyte serves as an electrochromic material, the electrolyte and the source of oxidizable ion for the counter electrode reaction thereby making the device cost effective to produce.

BRIEF DESCRIPTION OF THE DRAWINGS

FIG. 1 is a schematic elevational view of the cell tester device of the present invention accompanied by a scale for comparing the color of the indicating device and determining the state of charge of the cell;

FIG. 2 is a sectional view taken along the line shown in FIG. 1;

FIG. 3 is a perspective view of a battery having the cell tester label mounted on a housing;

FIG. 4 is a simplified schematic of the cell tester label device connected for an open circuit test of a battery.

FIG. 5 shows the simplified schematic of FIG. 4 with a switch added to isolate the cell tester label device from the cell;

FIG. 6 is a simplified schematic of a closed circuit cell tester label device;

DETAILED DESCRIPTION OF THE PREFERRED EMBODIMENTS

Figure 7:
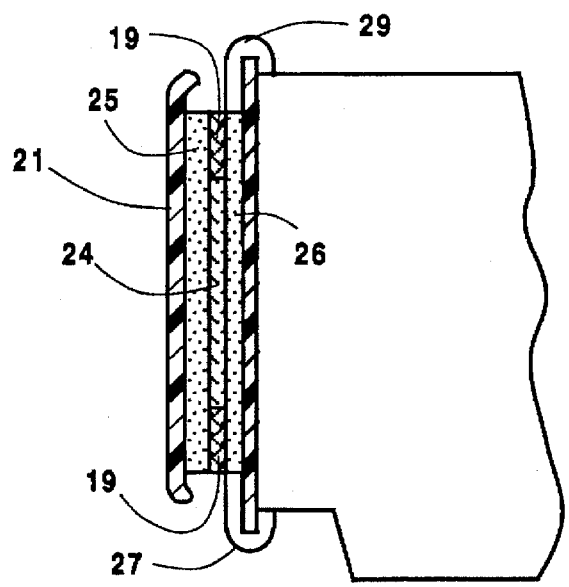
FIG. 7 is a partial sectional view showing a cell tester label applied to a battery.

Referring to FIG. 1 and FIG. 2, a typical electrochromic cell tester label of this invention is shown and indicated generally by the number 20. The label has a transparent or translucent cover 21 for containing the several components of the cell tester. The translucent or transparent plastic layer 21 is placed over electronically conductive transparent or translucent electrode 25. Electrical conductors 27 and 29 extend from each end of the cell tester 20 in which conductor 27 is shown as being of indeterminate length and has a terminal 31 for connection to an external terminal of a battery with its opposite end connected to the working electrodes of cell tester 20. Likewise, the conductor 29 is shown of indeterminate length and has a terminal 33 for connection to the opposite terminal of the battery to be measured and its opposite end is connected to the conductive layer 26 of cell tester 20. A switch is schematically illustrated at 35 which can be used to connect the cell tester 20 across the terminals of a battery being tested. A color scale 37 can be mounted on the housing of the cell tester 20 for providing a ready color comparisonfor the deposited metal ion to determine the state-of-charge of the battery.

In FIG. 2, the cell tester 20 is shown mounted on a battery 39, only a portion of which is shown. In the example shown here, the cell tester 20 comprises a transparent or translucent plastic layer 21, electrode 25, an ionically conducting gel electrolyte 24, and an electrically conductive layer 26 positioned on plastic sheet 31. Gel electrolyte layer 24 is maintained between electrode 25 and conductive layer 26 by adhesive seals 19. Conductive layer 26 can be part of the battery label or can be part of the battery housing. If it is part of the battery housing, then an electrical conductor, such as 27 or 29, would not be required since the conductive layer 26 would be part of the terminal of the battery being tested. Electrode 26 can be printed or coated on the transparent plastic sheet 21. In one embodiment, the tester device can be produced as a separate label stack or insert that can be assembled and then positioned appropriately on the battery as a separate insert.

Referring to FIG. 3, a typical C or D size dry cell battery is shown and indicated generally by the number 50. A typical battery has a cylindrical housing 51 and an end cover 53 in contact with positive terminal 55. The opposite end cover is indicated by 57. On the side of housing 51 is a cell label tester 60. The cell label tester can have one or more cells, for example three cells, similar to cell 20 of FIG. 1. Cell 64 can be poised to indicate a fresh battery. Cell 63 can be of a similar construction, however, having a different metal ion electrolyte solution and being poised to indicate a good condition of the battery, while cell 65 is again of similar construction with a different metal ion electrolyte solution which indicates that the battery should be replaced. Alternatively, cells 63, 64 and 65 can have the same metal ion concentration in their electrolyte solution and can be poised to indicate different states of battery condition by appropriate circuit components. Cell 65 is connected to the negative end cover 57 by means of a conductive strip of material 67 which is folded under and has a contact 69. At the opposite end of the cell label tester, a conductor 71 completes the connection to the positive terminal of the battery. Alternative means of making contact between the label tester cell or cells and the battery terminals may be used.

As shown in FIG. 3, the label cell tester is continuously in contact with the negative and positive external terminals of the battery. When used in such applications, it is preferred to use a solid state cell, the layers of which are applied as coatings over or printed on the surface of the transparent plastic sheet 21 shown in FIG. 1. It is preferred to use a suitable switch such as switch 35 (FIG. 1) to momentarily connect the cell tester label across the terminals of the battery and, after the reading is complete, the switch should be opened to electrically isolate the battery from the cell tester label.

As indicated above, the battery state indicating device can be in continuous electrical contact with the external terminals of the battery. Since the cell tester device does draw current, it is preferred to have some type of an external switch to isolate it from the battery. The cell tester device can be used in either an open circuit or a closed circuit mode. In the closed circuit mode, the voltage of the battery is tested under load. FIGS. 4 and 5 show a typical open circuit configuration for testing a battery. In FIG. 4, cell tester device 130 is connected in series with battery 131 to be tested. In FIG. 5, cell tester device 130 is again connected to battery 131; however, in this circuit a switch 133 is used to take the cell tester device out of the circuit so as not to discharge the battery. It can be seen in the open circuit test that no load other than the cell tester device itself is placed across the terminals of the battery being tested.

Referring to FIG. 6, this figure represents a typical closed circuit test in which a load resistor 135 is place across the cell tester device 130. An additional load resistor 136 can be used, if desired, to form a voltage divider circuit and provide additional control. The battery 131 is again connected for testing or isolated by a switch 133. In the open circuit measurement circuit, as shown in FIGS. 4 and 5, the test label cell should be poised to sense the range of voltage produced by the battery 131. When a different voltage range is produced by different types of batteries, different cell components can be used in the cell tester device. In the circuit of FIG. 6, the load resistors 135 and 136 can be varied to match the cell tester device 130 to the potential produced by the battery 131 in addition to selection of the appropriate components of the cell. The load resistors 135 and 136 can be formed by using portions of the working electrode or conductive layer. Such a component can be shaped or patterned to vary the resistance and serve as the load along which the potential decreases.

Figure 8:
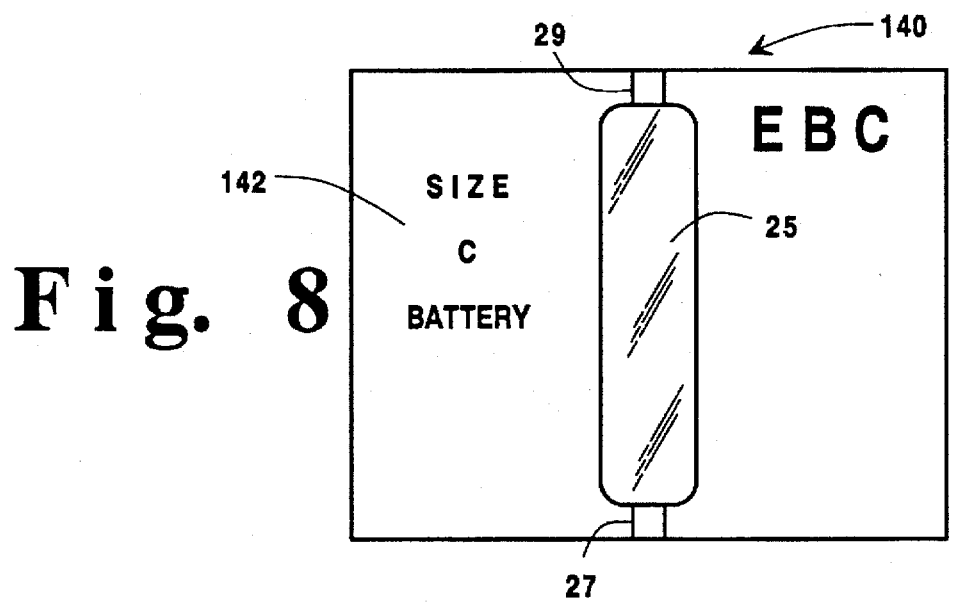
FIG. 8 is a partial elevational view of a label for a battery including a printed cell tester device of this invention.

FIGS. 7 and 8 show the several components of the cell tester applied as the label indicated generally by 140 using the same reference numbers for the same components shown in FIGS. 1 and 2. During the label printing process appropriate graphics 142 can be applied to the label. For example, the components of the cell tester can be provided by various means such as by printing or depositing the components in a preselected order on a label substrate using conductive ink or paint. The label tester can be prepared so that the working electrode is in electrical contact with one external terminal of the battery and the conductive layer is in electrical contact with the opposite terminal of the battery. Either electrical conductor 27 or 29, or both, can be printed on the label so that it terminates near one external terminal of the battery without making electrical contact. The open circuit can then be closed by bringing that electrical conductor on the label which is near one terminal of the battery into contact with that terminal to activate the tester. If desired, one conductor can be printed so that it will make electrical contact with a terminal of the battery when the label is applied.

The use of at least one switch is desired, preferably two switches, to reduce the chances of inadvertent activation of the tester. If desired, one of these end contacts could be made permanent by crimping the label edge over into intimate contact with that portion of the cell container. Another switch can be provided on the side of the cell if desired or on the opposite end of the cell.

Figure 9:
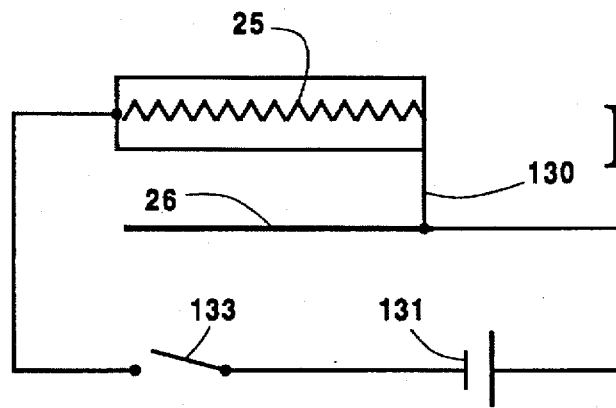
FIG. 9 is a schematic of an electrode arrangement shown connected by switch means to a cell to be tested.

The selection and matching of the voltage range of the cell tester device can thus be largely avoided by using testing circuits such as those shown in FIGS. 6 and 9. In FIG. 9 the resistivity of the electrode 25 provides the resistive load and, in combination with the cell 130, acts as a voltage divider. In this cell, the voltage drop across the cell tester device varies from the closed circuit voltage obtained at the left end of the electrode, as shown in FIG. 9, to a lower voltage (possibly zero volt) at the other end. With this type of indicator, the state-of-charge of the cell is determined by the position of the change of the visual appearance in the test cell device.

In the manufacture of the label tester, it is preferred to use a web of the substrate material which can hold many labels and run the web through suitable printing operations or coating operations where the graphics for each label can be applied to the web along with each layer of the tester. After the label tester has been applied, the web of material can be run through a suitable punch or die cutting operation to separate the individual labels from the web so that the labels can be applied to batteries in the finishing of the battery during the heat shrinking of the label.

From the above description it can be seen that a cell testing label can be provided for testing the state of a battery which can be applied to the housing of the battery and left in place at all times. Since the device does not rely on heat, the thermal mass of the battery will not affect the operation of the device. When the electrical circuit for the testing device is completed, the deposited metal ions will change the visual appearance of the tester device so that such change will indicate the state of the cell. Though the invention has been described with respect to a specific preferred embodiment thereof, many variations and modifications will become apparent to those skilled in the art. For example, one or more components of the tester can be vapor deposited during the assembly process. It is therefore the intention that the appended claims be interpreted as broadly as possible in view of the prior art to include all such variations and modifications.

What is claimed:

1. A cell tester device for an electrochemical cell having a first terminal and a second terminal of opposite polarity; said device comprising a first electrically conductive electrode adapted to contact the first terminal of the cell; an electrically conductive layer spaced apart from said electrode and adapted to contact the second terminal of the cell; and an immobilized metal ion electrolyte disposed between and in contact with the electrode and the conductive layer, said electrolyte comprising a solution of at least one salt of at least one metal which can be cathodically deposited from the solution of one of its simple or complex ions at least at the interface of the electrode and the electrolyte and the deposited metal ion having a different color than the electrolyte so that when the electrode makes contact with the first terminal of the cell and the conductive layer makes contact with the second terminal of the cell, the metal ion in the electrolyte will be reduced to provide a deposit at said interface that has a different visual appearance than the electrolyte that can be used to indicate the condition of the cell and which different visual appearance is observable to the user.

2. The cell tester device of claim 1 wherein the immobilized metal is an aqueous metal ion gelled electrolyte and said salt is a water-soluble salt.

3. The cell tester device of claim 2 wherein the working electrode has pores on its surface and a portion of the gel electrolyte is deposited into the pores.

4. The cell tester device of claim 2 wherein the first electrically conductive electrode is transparent or translucent and comprises indiumtin oxide.

5. The cell tester device of claim 2 wherein the aqueous metal ion gel electrolyte contains a polymer resin.

6. The cell tester device of claim 7 wherein the polymer resin is selected from the group consisting of hydroxyethyl cellulose, hydroxypropyl cellulose, polyethylene oxide, polypropylene oxide and polyvinyl alcohol.

7. The cell tester device of claim 2 wherein the salt of the metal is selected from the group consisting of bismuth, zinc, copper, silver, lead and mixtures thereof.

8. The cell tester device of claim 2 wherein the salt of the metal is bismuth or zinc.

9. The cell tester device of claim 2 wherein the conductive layer is selected from the group consisting of carbon, silver, nickel, titanium and conductive polymers.

10. A cell tester device for an electrochemical cell having a first terminal and a second terminal of opposite polarity; said device comprising a first electrically conductive electrode adapted to contact the first terminal of the cell; an electrically conductive layer spaced apart from said electrode and adapted to contact the second terminal of the cell; and an immobilized metal ion electrolyte disposed between and in contact with the electrode and the conductive layer, said electrolyte comprising a solution of at least one salt of at least one metal which can be cathodically deposited from the solution of one of its simple or complex ions at least at the interface of the electrode and the electrolyte and the deposited metal ion having a different color than the electrolyte so that when the electrode makes contact with the first terminal of the cell and the conductive layer makes contact with the second terminal of the cell, the metal ion in the electrolyte will be reduced to provide a deposit at said interface that has a different visual appearance than the electrolyte that can be used to indicate the condition of the cell which different visual appearance is observable to the user comprising a substrate and wherein said electrode is disposed on said substrate.

11. The cell tester device of claim 10 wherein the conductive layer is printed on the electrolyte or the electrolyte gel is printed on the conductive layer.

12. The cell tester device of claim 2 wherein the first electrically conductive electrode is disposed above the conductive layer and the aqueous metal ion gel electrolyte is secured between the electrode and the conductive layer by an adhesive placed around the periphery of the gel electrolyte and secured to the working electrode and the conductive layer.

13. A cell tester device for an electrochemical cell having a first terminal and a second terminal of opposite polarity; said device comprising a first electrically conductive electrode adapted to contact the first terminal of the cell; an electrically conductive layer spaced apart from said electrode and adapted to contact the second terminal of the cell; and an immobilized metal ion electrolyte disposed between and in contact with the electrode and the conductive layer, said electrolyte comprising a solution of at least one salt of at least one metal which can be cathodically deposited from the solution of one of its simple or complex ions at least at the interface of the electrode and the electrolyte and the deposited metal ion having a different color than the electrolyte so that when the electrode makes contact with the first terminal of the cell and the conductive layer makes contact with the second terminal of the cell, the metal ion in the electrolyte will be reduced to provide a deposit at said interface that has a different visual appearance than the electrolyte that can be used to indicate the condition of the cell which different visual appearance is observable to the user at least one of the electrode and conductive layer being an elongated member that functions as a variable resistance component for the cell tester device so that the electrical resistance can be varied for the cell tester device depending on the amount of resistance placed in the circuit when the cell tester device is connected to an electrochemical cell.

14. A cell tester device for an electrochemical cell having a first terminal and a second terminal of opposite polarity; said device comprising a first electrically conductive electrode adapted to contact the first terminal of the cell; an electrically conductive layer spaced apart from said electrode and adapted to contact the second terminal of the cell; and an immobilized metal ion electrolyte disposed between and in contact with the electrode and the conductive layer, said electrolyte comprising a solution of at least one salt of at least one metal which can be cathodically deposited from the solution of one of its simple or complex ions at least at the interface of the electrode and the electrolyte and the deposited metal ion having a different color than the electrolyte so that when the electrode makes contact with the first terminal of the cell and the conductive layer makes contact with the second terminal of the cell, the metal ion in the electrolyte will be reduced to provide a deposit at said interface that has a different visual appearance than the electrolyte that can be used to indicate the condition of the cell which different visual appearance is observable to the user and wherein said conductive layer functions as the variable resistance component.

15. The cell tester device of claim 10 wherein the substrate is a plastic film.

16. The cell tester device of claim 2 wherein an electrically nonconductive layer is deposited over the conductive layer and said electrically nonconductive layer is adapted to be secured to a housing of an electrochemical cell.

17. The cell tester device of claim 1 wherein the first electrode is from 0.1 to 250 microns thick the conductive layer is from 0.1 to 250 microns thick and the ionically conductive electrolyte is from 1 to 250 microns thick.

18. The cell tester device of claim 3 wherein the aqueous metal ion gel electrolyte contains a salt of a metal selected from the group consisting of $BiCl_3$, $ZnCl_2$, $AgCl$ and $PbCl_2$.

19. The cell tester device of claim 18 wherein the salt of the metal is BiCl3.

20. The cell tester device of claim 13 wherein the electrode contains indium-tin oxide, the conductive layer is carbon and the gel electrolyte contains LiBr.

21. The cell tester device of claim 10, wherein the electrode is printed on the substrate.

22. The cell tester of claim 21, wherein the substrate is incorporated into a label for an electrochemical cell.

23. The cell tester of claim 22, wherein the label is adhered to a housing of the electrochemical cell.

24. The cell tester of claim 23, wherein the label comprises one or more layers, and the substrate, electrode, conductive layer, and electrolyte are disposed on or within one or more of the layers of the label.

* * * * *